(12) United States Patent
Xu et al.

(10) Patent No.: US 11,864,432 B2
(45) Date of Patent: Jan. 2, 2024

(54) DISPLAY SUBSTRATE, DISPLAY PANEL AND DISPLAY APPARATUS

(71) Applicant: KunShan Go-Visionox Opto-Electronics Co., Ltd., Kunshan (CN)

(72) Inventors: Chuanzhi Xu, Kunshan (CN); Junhui Lou, Kunshan (CN); Lu Zhang, Kunshan (CN); Xiaoyu Gao, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 468 days.

(21) Appl. No.: 17/338,908

(22) Filed: Jun. 4, 2021

(65) Prior Publication Data

US 2021/0296419 A1 Sep. 23, 2021

Related U.S. Application Data

(63) Continuation of application No. PCT/CN2020/084689, filed on Apr. 14, 2020.

(30) Foreign Application Priority Data

May 23, 2019 (CN) .......................... 201910434976.2

(51) Int. Cl.
*H10K 59/126* (2023.01)
*H10K 59/122* (2023.01)
(Continued)

(52) U.S. Cl.
CPC ......... *H10K 59/126* (2023.02); *H10K 59/122* (2023.02); *H10K 59/131* (2023.02); *H10K 59/173* (2023.02); *H10K 59/179* (2023.02)

(58) Field of Classification Search
CPC ............... H10K 59/121; H10K 59/126; H10K 59/17–1795; H10K 59/65
See application file for complete search history.

(56) References Cited

U.S. PATENT DOCUMENTS

2005/0122458 A1 6/2005 Yang
2019/0393286 A1 12/2019 Ding et al.
(Continued)

FOREIGN PATENT DOCUMENTS

CN 103336395 A 10/2013
CN 106353945 A 1/2017
(Continued)

OTHER PUBLICATIONS

International Search Report dated Jul. 17, 2020 in corresponding International application No. PCT/CN2020/084689; 6 pages.
(Continued)

*Primary Examiner* — Daniel P Shook
(74) *Attorney, Agent, or Firm* — Maier & Maier, PLLC

(57) ABSTRACT

A display substrate, a display panel, and a display apparatus. The display substrate includes: a first display area including a plurality of first sub-pixels; a second display area including a plurality of second sub-pixels; a shielding layer provided in the second display area; a first signal line configured to provide a control signal to the first sub-pixels, wherein the first signal line extends from the first display area through the second display area, and a portion of the first signal line located in the second display area is provided above the shielding layer; and a pixel circuit provided below the shielding layer and configured to drive the second sub-pixels; wherein the shielding layer is configured to shield an electric field between the portion of the first signal line located in the second display area and the pixel circuit.

20 Claims, 5 Drawing Sheets

(51) Int. Cl.
*H10K 59/131* (2023.01)
*H10K 59/173* (2023.01)
*H10K 59/179* (2023.01)

(56) References Cited

U.S. PATENT DOCUMENTS

2020/0034100 A1  1/2020  Fan et al.
2020/0135830 A1  4/2020  Seo et al.
2020/0380917 A1* 12/2020  Zhu ..................... G09G 3/3216

FOREIGN PATENT DOCUMENTS

| CN | 106847170 A | 6/2017 |
| CN | 106952940 A | 7/2017 |
| CN | 108154842 A | 6/2018 |
| CN | 108597436 A | 9/2018 |
| CN | 109272930 A | 1/2019 |
| CN | 109389907 A | 2/2019 |
| CN | 109600459 A | 4/2019 |
| CN | 109637444 A | 4/2019 |
| CN | 111129079 A | 5/2020 |
| IN | 108376696 A | 8/2018 |

OTHER PUBLICATIONS

Written Opinion of the International Searching Authority dated Jul. 17, 2020 in corresponding International Application No. PCT/CN2020/084689, 7 pages.

* cited by examiner

DISPLAY SUBSTRATE, DISPLAY PANEL AND DISPLAY APPARATUS

CROSS-REFERENCE TO RELATED APPLICATIONS

The present application is a continuation application of International Application No. PCT/CN2020/084689 filed on Apr. 14, 2020, which is incorporated herein by reference in its entirety.

TECHNICAL FIELD

The present disclosure relates to the field of display technology, and in particular to a display substrate, a display panel, and a display apparatus.

BACKGROUND

With the rapid development of electronic devices, users have higher and higher requirements for a screen-to-body ratio, such that a full-screen display of the electronic devices has attracted more and more attention in the industry. An electronic device such as a mobile phone, a tablet computer, etc., needs to have a front camera, an earpiece, an infrared sensor element, and the like integrated therein. A notch or hole may be provided in a display screen, and the camera, the earpiece, the infrared sensor element, and the like may be disposed in an area of the notch or hole on the display screen. However, the area of the notch on the display screen cannot be used to display images. As for the electronic device that implements a camera function, external light may enter to a photosensitive component which is located below the display screen through the area of the notch or hole on the display screen. However, such an electronic device does not have a full screen in the true sense, and cannot display images in all areas of the entire display screen, for example, this electronic device cannot display images in an area of the camera on the display screen.

SUMMARY

According to a first aspect of embodiments of the present disclosure, there is provided a display substrate comprising: a first display area comprising a plurality of first sub-pixels; a second display area comprising a plurality of second sub-pixels; a shielding layer provided in the second display area; a first signal line configured to provide a control signal to the first sub-pixels, wherein the first signal line extends from the first display area through the second display area, and a portion of the first signal line located in the second display area is provided above the shielding layer; and at least one pixel circuit provided below the shielding layer and configured to drive the second sub-pixels; wherein the shielding layer is configured to shield an electric field between the portion of the first signal line located in the second display area and the pixel circuit.

According to a second aspect of embodiments of the present disclosure, there is provided a display panel comprising: the above-mentioned display substrate; and an encapsulation structure, wherein the first display area is at least partially surrounded by the second display area; the encapsulation structure comprises a polarizer which at least covers the second display area; and the first display area is not covered by the polarizer.

According to a third aspect of embodiments of the present disclosure, there is provided a display apparatus comprising: a main body having a component arranging area; and the above-mentioned display panel covering the main body; wherein the component arranging area is located below the first display area, and provided with at least one photosensitive component therein which emits or receives light through the first display area; and the at least one photosensitive component comprises a camera and/or a light sensor.

In the display substrate, display panel, and display apparatus according to the embodiments of the present disclosure, a shielding layer is provided in a second display area, and a portion of a first signal line located in the second display area is provided above the shielding layer and at least one pixel circuit is provided below the shielding layer, such that the shielding layer can shield an electric field created between the first signal line and at least one component in the pixel circuit for the second sub-pixels, so as to avoid a poor display effect in the second display area due to an influence of the portion of the first signal line located in the second display area on a signal received by the pixel circuit for the second sub-pixels, ensuring the display effect in the second display area and improving user experience.

DETAILED DESCRIPTION

Figure 1:
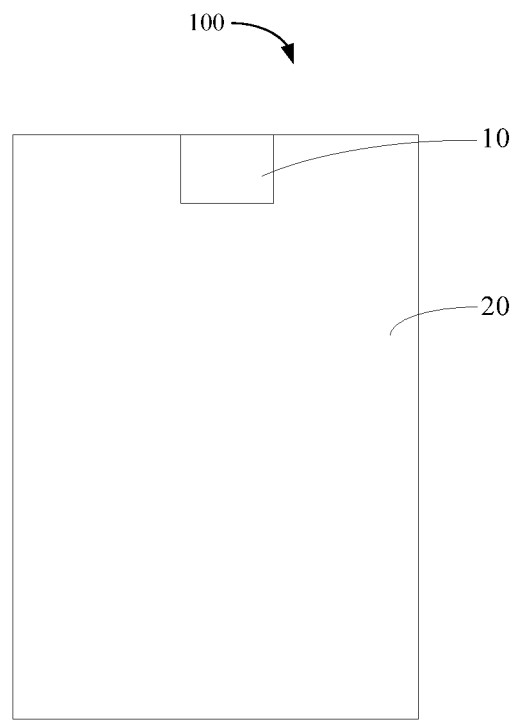
FIG. 1 is a top view of a display substrate according to an embodiment of the present disclosure.

Exemplary embodiments will be described herein in detail, and examples thereof are shown in the accompanying drawings. When the following description refers to the accompanying drawings, unless otherwise indicated, the same reference numerals in different drawings represent the same or similar elements. The implementations described in the following exemplary embodiments do not represent all implementations consistent with the present disclosure. Rather, they are merely examples of apparatuses consistent with some aspects of the present disclosure as detailed in the appended claims.

As mentioned in the BACKGROUND, an electronic device may be provided with a notch area on a display screen thereof, and at least one photosensitive component such as a camera and an infrared sensor element may be disposed in the notch area, external light may enter to the photosensitive component through the notch area. However, since the notch area cannot be used to display images, a full-screen display of the electronic device cannot be realized.

By providing a transparent display screen on the electronic device and disposing the photosensitive component below the transparent display screen, the full-screen display of the electronic device may be realized while ensuring a normal operation of the photosensitive component. The display screen of the electronic device may include the transparent display screen and a non-transparent display screen. The transparent display screen may be used for display and light transmission, and the non-transparent display screen may be used for display. A structure of the transparent display screen may be different from that of the non-transparent display screen, and a driving mode of the transparent display screen may also be different from that of the non-transparent display screen. For example, the driving mode of the non-transparent display screen may be generally an active driving mode, while the driving mode of the transparent display screen may be a passive driving mode or an active driving mode. The active driving mode of the transparent display screen may be different from that of the non-transparent display screen, in which case the transparent display screen and the non-transparent display screen cannot share a scan line and a data line accordingly. The active driving mode of the non-transparent display screen means that an anode of the pixel in the non-transparent display screen is connected, for example, electrically connected, with a signal line of the electronic device through a pixel circuit, and the signal line provides a signal to the pixel in the non-transparent display screen through the pixel circuit. The passive driving mode of the transparent display screen means that an anode of the pixel in the transparent display screen is connected, for example, electrically connected, directly with the signal line of the electronic device, and the signal line provides a signal directly to the pixel in the transparent display screen. The active driving mode of the transparent display screen means that the anode of the pixel in the transparent display screen is connected, for example, electrically connected, with the signal line of the electronic device through a first transistor, and the signal line provides a signal to the pixel in the transparent display screen through the first transistor.

When the electronic device is displaying, a display effect of the non-transparent display screen may be deteriorated. The inventor found through research that the reason for this problem is that a data line or a scan line of the transparent display screen is connected with a driver chip located in a bezel area of the electronic device through the non-transparent display screen, and a portion of the data line and/or the scan line of the transparent display screen located in the non-transparent display screen may be coupled with at least one component in the pixel circuit of the non-transparent display screen, such that an electric field may be created between the portion of the data line and/or the scan line of the transparent display screen and the component such as a transistor in the pixel circuit of the non-transparent display screen, and the created electric field may have an influence on the stability of a signal received by the pixel circuit in the non-transparent display screen, causing the display effect of the non-transparent display screen to be deteriorated.

In order to solve the above-mentioned problems, embodiments of the present disclosure provide a display substrate, a display panel, and a display apparatus.

The display substrate, display panel, and display apparatus according to the embodiments of the present disclosure will be described in detail below with reference to the accompanying drawings. Features in the following embodiments and implementations may be supplemented or combined with each other without any conflict.

The embodiment of the present disclosure provides a display substrate. Referring to FIG. 1, the display substrate 100 may include a first display area 10 and a second display area The first display area 10 may have a driving mode different from that of the second display area 20. The driving mode of the second display area 20 may be an active driving mode, and a plurality of pixels in the second display area 20 may be electrically connected with a signal line of the display substrate 100 through at least one pixel circuit.

Figure 2:
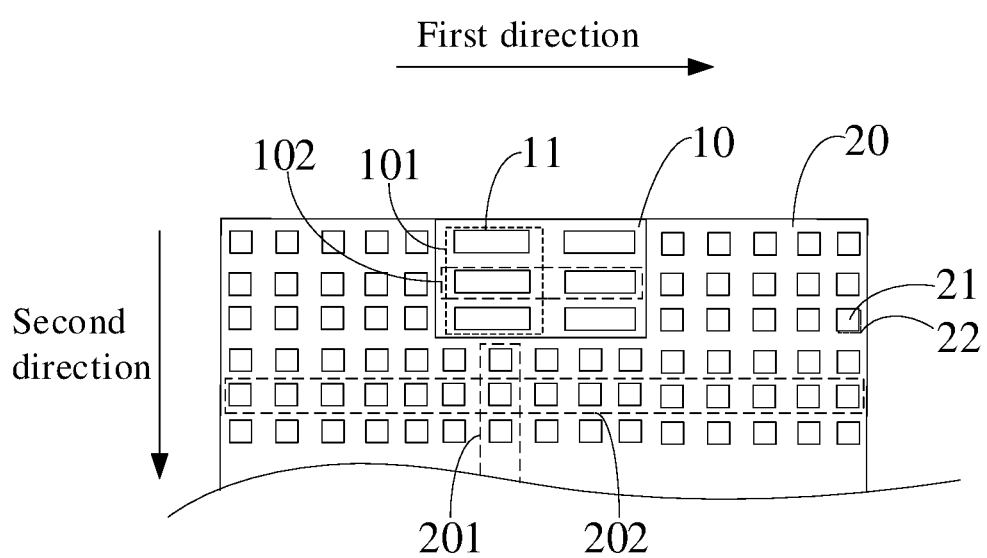
FIG. 2 is a partial schematic diagram of an arrangement of sub-pixels in the display substrate shown in FIG. 1.

Referring to FIG. 2, the display substrate 100 may be provided with a plurality of first sub-pixels 11 in the first display area 10 and a plurality of second sub-pixels 21 in the second display area 20.

Figure 3:
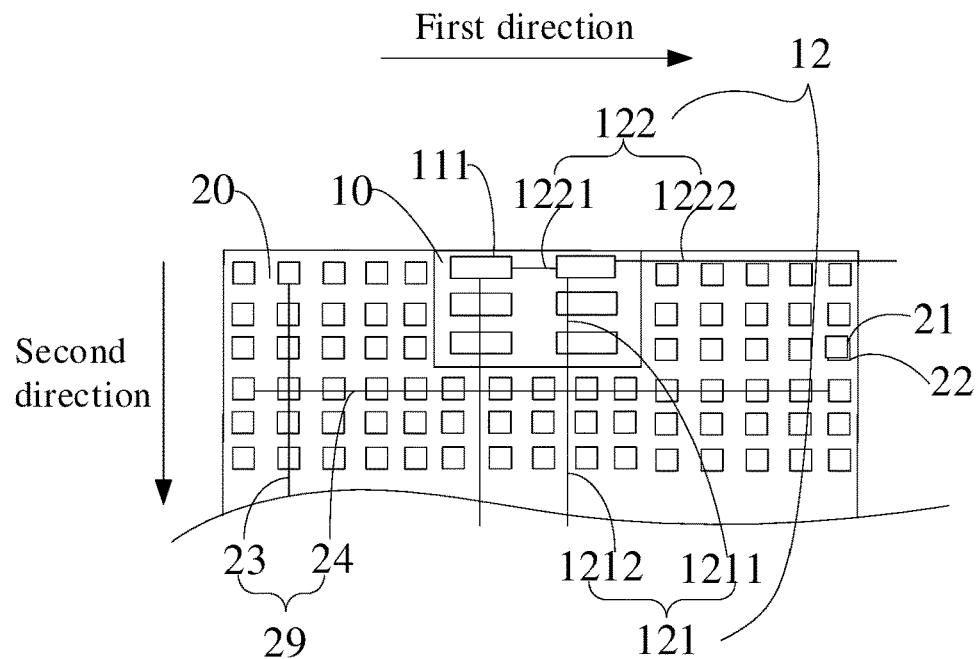
FIG. 3 is a schematic diagram of a signal line in the display substrate shown in FIG. 2.
Figure 4:
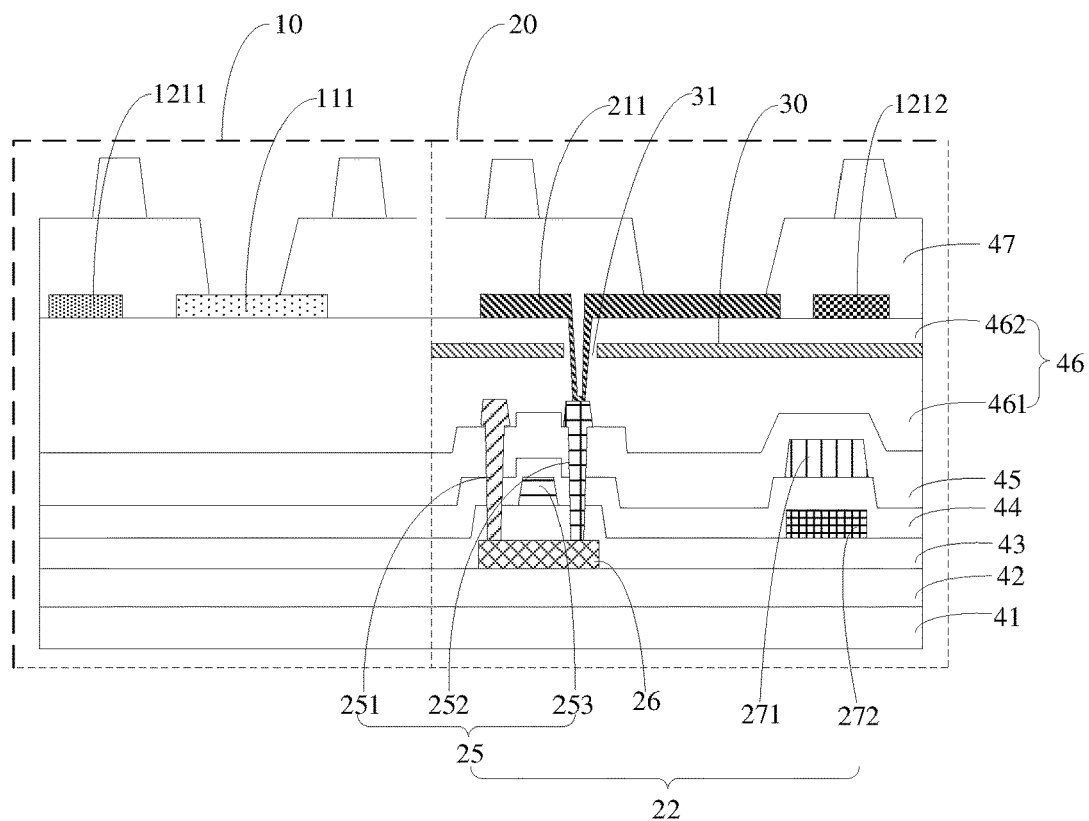
FIG. 4 is a cross-sectional view of the display substrate shown in FIG. 2.

Referring to FIGS. 3 and 4, the display substrate 100 may further include a first signal line 12 for providing a control signal to the first sub-pixels 11 and at least one pixel circuit 22 for driving the second sub-pixels 21. The first signal line 12 may be connected to a driver chip located in a bezel area of the display substrate 100, and the first signal line 12 may extend from the first display area 10 to the driver chip through the second display area 20. The pixel circuit 22 may be disposed in the second display area 20. The second display area 20 may be provided with a shielding layer 30 therein, a portion of the first signal line 12 located in the second display area 20 may be provided above the shielding layer 30, and the pixel circuit 22 may be provided below the shielding layer 30. The shielding layer 30 may be used to shield an electric field between the portion of the first signal line 12 located in the second display area 20 and at least one component in the pixel circuit 22.

The first signal line 12 may include a first data line 121 and/or a first scan line 122. Referring to FIG. 3, the first data line 121 may be used to provide a data signal to the first sub-pixels 11, and the first scan line 122 may be used to provide a scan signal to the first sub-pixels 11. When the first signal line 12 includes the first data line 121, the first data line 121 may include a first segment 1211 in the first display area 10 and a second segment 1212 in the second display area 20. When the first signal line 12 includes the first scan line 122, the first scan line 122 may include a third segment 1221 in the first display area 10 and a fourth segment 1222 in the second display area 20. The portion of the first signal line 12 located in the second display area 20 may be provided above the shielding layer 30. In other words, the second segment 1212 and the fourth segment 1222 may be provided above the shielding layer 30.

In the display substrate 100 according to the embodiment of the present disclosure, the shielding layer 30 is provided in the second display area 20, and a portion of the first signal line 12 located in the second display area 20 is provided above the shielding layer 30 and the pixel circuit 22 is provided below the shielding layer 30, such that the shielding layer 30 can shield an electric field created between the portion of the first signal line 12 located in the second display area 20 and the component in the pixel circuit 22 for the second sub-pixels 21, so as to avoid a poor display effect in the second display area 20 due to an influence of the portion of the first signal line 12 located in the second display area 20 on a signal received by the pixel circuit 22 for the second sub-pixels 21, ensuring the display effect in the second display area 20 and improving user experience.

Optionally, the first display area 10 may have a greater light transmittance than that of the second display area 20. Since the light transmittance of the first display area 10 is greater than that of the second display area 20, by providing at least one photosensitive component below the first display area 10, a full-screen display of the display substrate may be realized while ensuring a normal operation of the photosensitive component.

Optionally, the pixel circuit 22 for driving the second sub-pixels 21 may include a 2T1C circuit, a 3T1C circuit, a 3T2C circuit, a 7T1C circuit, or a 7T2C circuit, where T represents a transistor and C represents a capacitor. That is, the components in the pixel circuit 22 for the second sub-pixels 21 may include a second transistor and a capacitor. The shielding layer 30 may shield an electric field between the portion of the first signal line 12 located in the second display area 20 and a gate of the second transistor, and the shielding layer 30 may also shield an electric field between the portion of the first signal line 12 located in the second display area 20 and an electrode plate of the capacitor.

The shielding layer 30 may be connected to a voltage stabilization signal of the display substrate 100 or to a voltage source with a stable voltage, such that a stable electric field may be created between the shielding layer 30 and the component in the pixel circuit 22 for the second sub-pixels 21. The stable electric field may not have any influence on the signal received by the pixel circuit 22 for the second sub-pixels 21, while enabling the shielding layer 30 to shield the electric field between the portion of the first signal line 12 located in the second display area 20 and the component in the pixel circuit 22.

Optionally, the second display area 20 may have a fingerprint identification function, and the shielding layer 30 may have a light transmittance which is greater than or equal to 70%, so as to meet the requirement of the light transmittance for the second display area 20 to identify fingerprints. Further, the shielding layer 30 may include a conductive material, for example, the shielding layer 30 may include at least one of indium tin oxide, indium zinc oxide, silver-doped indium tin oxide, or silver-doped indium zinc oxide. In other embodiments, in the case when the second display area 20 does not have the fingerprint identification function, the shielding layer 30 may also include a non-light-transmitting material.

Optionally, the shielding layer 30 may cover the second display area 20. In this case, the shielding layer 30 may have the best shielding effect on the electric field between the portion of the first signal line 12 located in the second display area 20 and the component in the pixel circuit 22 for the second sub-pixels 21.

In another embodiment, the shielding layer 30 may have the same shape as that of the portion of the first signal line 12 located in the second display area 20, and may be provided below the portion of the first signal line 12 located in the second display area 20 correspondingly. In this case, materials required for preparing the shielding layer 30 may be saved while ensuring the shielding effect of the shielding layer 30.

Each of the second sub-pixels 21 may include a first electrode 211, a first light-emitting structure located on the first electrode 211, and a second electrode located on the first light-emitting structure. Each of the first sub-pixels 11 may include a third electrode 111, a second light emitting structure located on the third electrode 111, and a fourth electrode located on the second light emitting structure. The first light-emitting structure and the second light-emitting structure may be formed in the same process step, and the second electrode and the fourth electrode may be formed in the same process step, for example, formed by an evaporation process using the same mask. The first electrode 211 and the third electrode 111 may be anodes, the second electrode and the fourth electrode may be cathodes, and the second electrode and the fourth electrode may be a connected planar electrode.

A driving mode of the first sub-pixels 11 in the first display area 10 may be a passive driving mode or an active driving mode.

In the display substrate 100 as shown in FIGS. 3 and 4, the driving mode of the first sub-pixels 11 is the passive driving mode. In the display substrate 100 as shown in FIG. 3, the first signal line includes the first data line 121 and the first scan line 122. The first data line 121 may be connected to the third electrodes 111 of the first sub-pixels 11, and the first scan line 122 may be connected to the third electrodes 111 of the first sub-pixels 11. When the driving mode of the first sub-pixels 11 is the passive driving mode, a wiring arrangement in the first display area 10 is relatively simple, which can reduce a structural complexity in the first display area 10, such that an influence of superposition of diffraction patterns caused by a complex wiring in the first display area 10 on imaging can be reduced when external light enters to the first display area 10.

Figure 5:
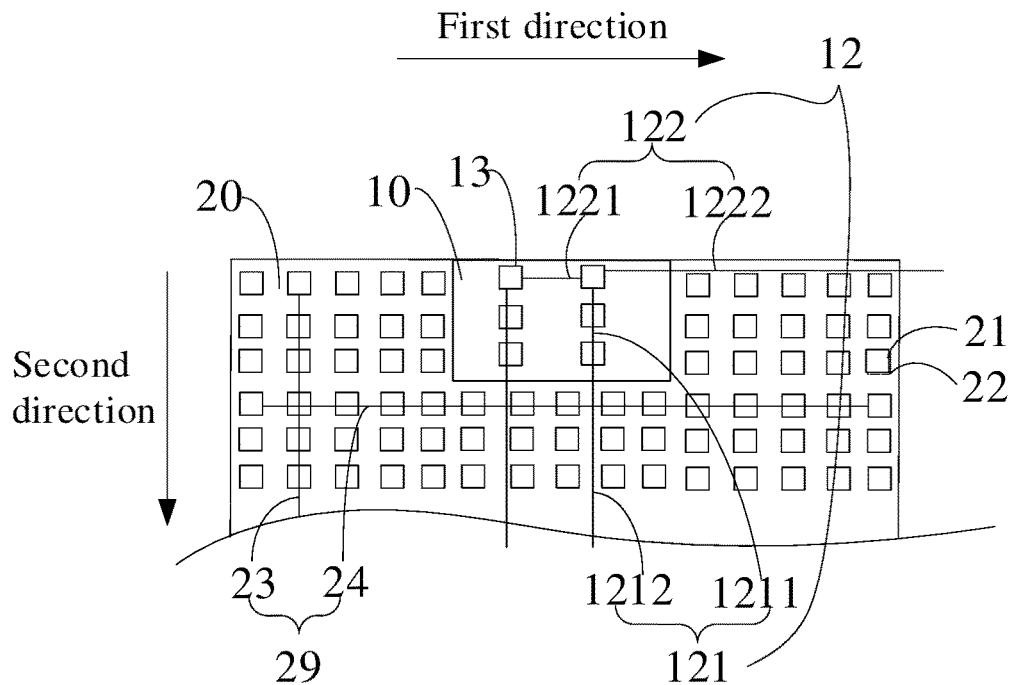
FIG. 5 is another schematic diagram of a signal line in the display substrate shown in FIG. 2, which is different from FIG. 3 in a driving mode of a first display area.
Figure 6:
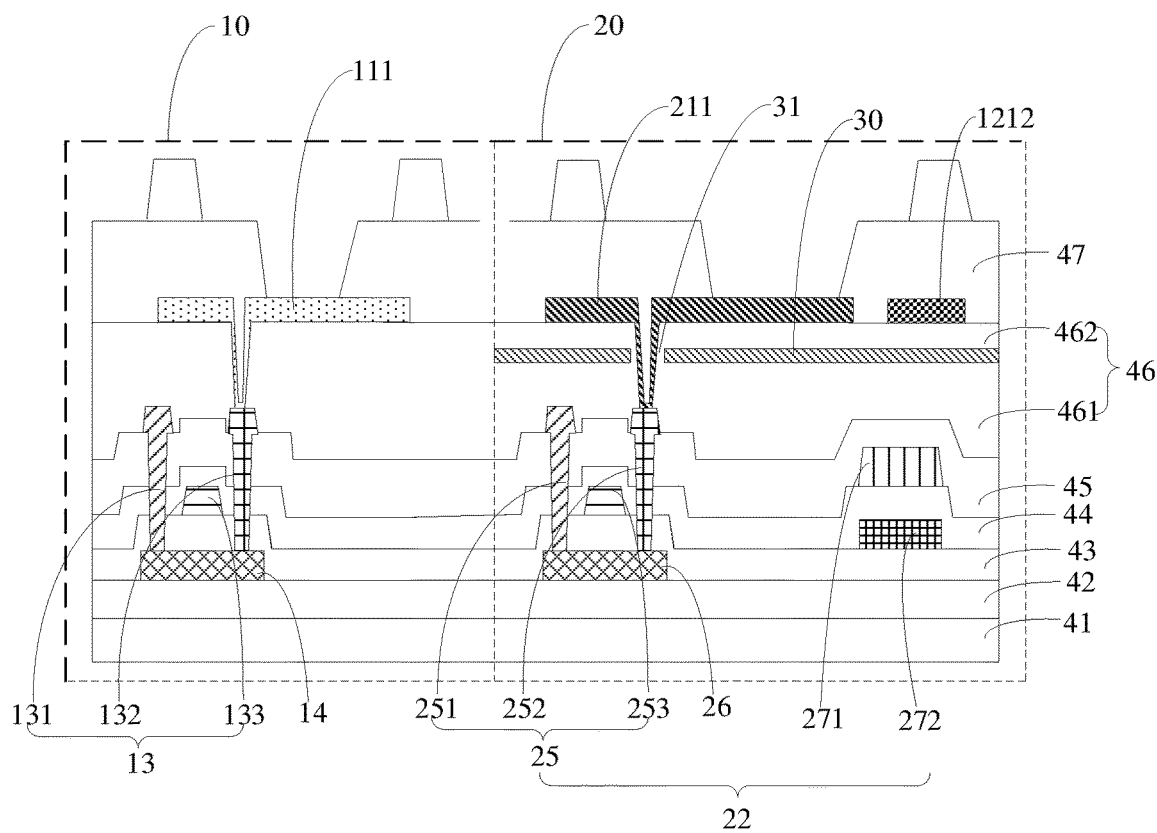
FIG. 6 is another cross-sectional view of the display substrate shown in FIG. 2, which is different from FIG. 4 in a driving mode of a first display area.

In the display substrate 100 as shown in FIGS. 5 and 6, the driving mode of the first sub-pixels 11 is the active driving mode. When the driving mode of the first sub-pixels 11 is the active driving mode, the first display area 10 may be provided with a plurality of first transistors 13 corresponding to the first sub-pixels 11 one-to-one. Each of the first transistors 13 may include a source 131, a drain 132 and a gate 133. The first signal line 12 may include the first data line 121 and/or the first scan line 122. The first data line 121 may be connected to the sources 131 of the first transistors 13, the first scan line 122 may be connected to the gates 133 of the first transistors 13, and the third electrodes 111 of the first sub-pixels 11 may be connected to the drains 132 of the first transistors 13 respectively.

Optionally, referring again to FIG. 2, the first sub-pixels 11 in the first display area may be divided into at least one first sub-pixel group 101, and each first sub-pixel group 101 may include a plurality of first sub-pixels 11 arranged at intervals in a second direction. When the first sub-pixels 11 in the first display area 10 are divided into a plurality of first sub-pixel groups 101, the plurality of first sub-pixel groups 101 may be arranged at intervals in a first direction. Referring to FIG. 3, when the driving mode of the first sub-pixels 11 is the passive driving mode, the third electrodes 111 of the first sub-pixels 11 in the same first sub-pixel group 101 may be connected to the same first data line 121. Referring to FIG. 5, when the driving mode of the first sub-pixels 11 is the active driving mode, the first transistors 13 corresponding to the first sub-pixels 11 in the same first sub-pixel group 101 may be connected to the same first data line 121.

Optionally, referring again to FIG. 2, the first sub-pixels 11 in the first display area may also be divided into at least one second sub-pixel group 102, and each second sub-pixel group 102 may include a plurality of first sub-pixels 11 arranged at intervals in the first direction. When the first sub-pixels 11 in the first display area 10 are divided into a plurality of second sub-pixel groups 102, the plurality of second sub-pixel groups 102 may be arranged at intervals in the second direction. Referring to FIG. 3, when the driving mode of the first sub-pixels 11 is the passive driving mode, the third electrodes 111 of the plurality of first sub-pixels 11 in the same second sub-pixel group 102 may be connected to the same first scan line 122. Referring to FIG. 5, when the driving mode of the first sub-pixels is the active driving mode, the first transistors 13 corresponding to the plurality of first sub-pixels 11 in the same second sub-pixel group 102 may be connected to the same first scan line 122.

Referring again to FIG. 3 or FIG. 5, the display substrate 100 may be further provided with a second signal line 29 therein. The second signal line 29 may include a second data line 23 and/or a second scan line 24. The second data line 23 may be used to provide a data signal to the second sub-pixels 21, and the second scan line 24 may be used to provide a scan signal to the second sub-pixels 21.

Optionally, referring to FIGS. 2 and 3, the second sub-pixels 21 in the second display area 20 may be divided into at least one third sub-pixel group 201, and each third sub-pixel group 201 may include a plurality of second sub-pixels 21 arranged at intervals in the second direction. When the second sub-pixels 21 in the second display area 20 are divided into a plurality of third sub-pixel groups 201, the plurality of third sub-pixel groups 201 may be arranged at intervals in the first direction. The pixel circuit 22 for the plurality of second sub-pixels 21 in the same third sub-pixel group 201 may be connected to the same second data line 23.

The second sub-pixels 21 in the second display area 20 may also be divided into at least one fourth sub-pixel group 202, and each fourth sub-pixel group 202 may include a plurality of second sub-pixels 21 arranged at intervals in the first direction. When the second sub-pixels 21 in the second display area 20 are divided into a plurality of fourth sub-pixel groups 202, the plurality of fourth sub-pixel groups 202 may be arranged at intervals in the second direction. The pixel circuit 22 for the plurality of second sub-pixels 21 in the same fourth sub-pixel group 202 may be connected to the same second scan line 24.

Optionally, the first direction and the second direction may be perpendicular to each other. The first direction may be a row direction (which may also be referred to as a horizontal direction), and the second direction may be a column direction (which may also be referred to as a vertical direction). Alternatively, the first direction may be the column direction, and the second direction may be the row direction. The present disclosure merely takes the first direction as the row direction and the second direction as the column direction as an example for illustration, and other cases are not shown in the drawings.

Optionally, the second signal line 29 may be located below the shielding layer 30, such that the shielding layer 30 may shield an electric field between the second signal line 29 and the first signal line 12, so as to prevent the electric field from being created between the second signal line 29 and the first signal line 12 to affect the stability of a signal transmitted by the second signal line 29, thereby improving the display effect in the second display area 20.

Referring to FIGS. 4 and 6, the display substrate 100 may further include a base substrate 41, a buffer layer 42 located on the base substrate 41, a second semiconductor layer 26 and a first semiconductor layer 14 formed on the buffer layer 42, a gate insulating layer 43 formed on the second semiconductor layer 26 and the first semiconductor layer 14, a capacitor insulating layer 44 located above the gate insulating layer 43, an interlayer dielectric layer 45 located above the capacitor insulating layer 44, a planarization layer 46 located above the interlayer dielectric layer 45, and a pixel defining layer 47 located on the planarization layer 46. A second transistor 25 in the pixel circuit 22 in the second display area may include a source 251, a drain 252, and a gate 253. The gate 253 may be located between the gate insulating layer 43 and the capacitor insulating layer 44. The source 251 and the drain 252 may be located on the interlayer dielectric layer 45 and contact with the second semiconductor layer 26 through through-holes which are in the gate insulating layer 43, the capacitor insulating layer 44 and the interlayer dielectric layer 45 respectively. A capacitor of the pixel circuit 22 may include an upper electrode plate 271 and a lower electrode plate 272. The upper electrode plate 271 may be located between the capacitor insulating layer 44 and the interlayer dielectric layer 45, and the lower electrode plate 272 may be located between the gate insulating layer 43 and the capacitor insulating layer 44.

The planarization layer 46 may include a lower planarization layer 461 and an upper planarization layer 462, and the shielding layer 30 may be located between the lower planarization layer 461 and the upper planarization layer 462.

Referring to FIGS. 4 and 6, the first electrodes 211 of the second sub-pixels 21 may be disposed above the shielding layer 30. The shielding layer 30 may be provided with a through-hole 31 therein, and the drain 252 of the second transistor 25 in the pixel circuit 22 for the second sub-pixels 21 may be electrically connected with the respective first electrode 211 through the through-hole 31. In this way, the shielding layer 30 may be provided without affecting the operation of the second sub-pixels 21 which is driven by the pixel circuit 22.

Referring again to FIG. 6, when the driving mode of the first display area 10 is the active driving mode, the sources 131 and the drains 132 of the first transistors 13 corresponding to the first sub-pixels may be located on the interlayer dielectric layer 45, and contact with the first semiconductor layer 14 through through-holes which are in the gate insulating layer 43, the capacitor insulating layer 44 and the interlayer dielectric layer 45 respectively, and the gates 133 may be located between the gate insulating layer 43 and the capacitor insulating layer 44.

Optionally, referring to FIG. 3, when the first signal line includes the first data line 121, the first data line 121 may include the first segment 1211 located in the first display area and the second segment 1212 located in the second display area 20.

Optionally, the first segment 1211 and the second segment 1212 may be located at different layers, and a first insulating layer may be provided between the first segment 1211 and the second segment 1212. A first through-hole may be provided in the first insulating layer, and the first segment 1211 may be connected with the second segment 1212 through the first through-hole. In this way, the first segment 1211 located in the first display area 10 may be separated from the second segment 1212 located in the second display area 20 through the first insulating layer, in other words, the first segment 1211 may be provided below the first insulating layer, and the second segment 1212 may be provided above the first insulating layer. However, the arrangement of the first segment 1211 and the second segment 1212 with respect to the first insulating layer is not limited to this, and advantages of such an arrangement will be described in detail below. In addition, since the second segment 1212 is located above the shielding layer 30, the shielding layer 30 may shield an electric field between the second segment 1212 and the second transistor 25 or an electric field between the second segment 1212 and the second signal line 29, thereby improving the stability of signals received by the second sub-pixels 21 and thus improving the display effect in the second display area 20.

Referring to FIG. 6, the first electrodes 211 may be provided above the shielding layer 30, and the second segment 1212 of the first data line 121 may be formed in the same process step with the first electrodes 211. Specifically, when forming the second segment 1212 of the first data line 121 and the first electrodes 211, a metal layer may be firstly formed on an entire surface of the second display area 20, then the metal layer may be patterned, for example, after a corrosion or etching process, patterns left on the metal layer are the first electrodes 211 and the second segment 1212 of the first data line 121. In this way, a process flow and complexity of a manufacturing process of the display substrate can be simplified.

The driving mode of the first display area 10 is the active driving mode. When the first signal line includes the first data line 121, the first segment 1211 of the first data line 121 may be formed in the same process step with the sources 131 and the drains 132 of the first transistors 13. In this case, the first insulating layer includes the planarization layer 46. In this way, a process flow and complexity of a manufacturing process of the display substrate can be simplified.

Optionally, when the shielding layer 30 includes a light-transmitting material, the first segment 1211 of the first data line 121 in the first display area may be formed in the same process step with the shielding layer 30. In this case, the first insulating layer includes the upper planarization layer 462. In this way, a process flow and complexity of a manufacturing process of the display substrate can be simplified.

Optionally, when the first signal line includes the first data line 121, the first data line 121 may include the first segment 1211 in the first display area 10 and the second segment 1212 in the second display area 20. The first electrodes 211 of the second sub-pixels 21 may be provided above the shielding layer 30.

The second segment 1212 may be formed in the same process step with the first electrodes 211 of the second sub-pixels 21. The first segment 1211 may be formed in the same process step with the third electrodes 111 of the first sub-pixels 11. The first electrodes 211, the third electrodes 111, the first segment 1211 and the second segment 1212 may be located at the same layer, and the first segment 1211 and the second segment 1212 are connected. In this way, there is no need to provide a through-hole in the insulating layer to connect the first segment and the second segment, which simplifies a preparation process of the first data line.

Optionally, referring to FIG. 3 or FIG. 5, when the first signal line includes the first scan line 122, the first scan line 122 may include the third segment 1221 in the first display area 10 and the fourth segment 1222 in the second display area 20. The fourth segment 1222 may be located above the shielding layer 30. A second insulating layer may be provided between the third segment 1221 and the fourth segment 1222. A second through-hole may be provided in the second insulating layer, and the third segment 1221 may be connected with the fourth segment 1222 through the second through-hole. In this way, the third segment 1221 located in the first display area 10 may be separated from the fourth segment 1222 located in the second display area 20 through the second insulating layer, in other words, the third segment 1221 may be provided below the second insulating layer, and the fourth segment 1222 may be provided above the second insulating layer. However, the arrangement of the third segment 1221 and the fourth segment 1222 with respect to the second insulating layer is not limited to this, and advantages of such an arrangement will be described in detail below. In addition, since the fourth segment 1222 is located above the shielding layer 30, the shielding layer 30 may shield an electric field between the fourth segment 1222 and the second transistor 25 or an electric field between the fourth segment 1222 and the second signal line 29, thereby improving the stability of signals received by the second sub-pixels 21 and thus improving the display effect in the second display area 20.

Optionally, the fourth segment 1222 of the first scan line 122 may be formed in the same process step with the first electrodes 211 of the second sub-pixels 21. Specifically, when forming the fourth segment 1222 of the first scan line 122 and the first electrodes 211, a metal layer may be firstly formed on an entire surface of the second display area 20, then the metal layer may be patterned, for example, after a corrosion or etching process, patterns left on the metal layer are the first electrodes 211 and the fourth segment 1222 of the first scan line 122. In this way, a process flow and complexity of a manufacturing process of the display substrate can be simplified.

Optionally, the third segment 1221 of the first scan line 122 may be located at the same layer with the gates 133. In this case, the second insulating layer may include the capacitor insulating layer 44, the interlayer dielectric layer 45, and the planarization layer 46.

Optionally, the third electrode 111 of each first sub-pixel may include at least one electrode block, and the light-emitting structure may include a light-emitting structure block disposed on the electrode block correspondingly.

Figure 7:
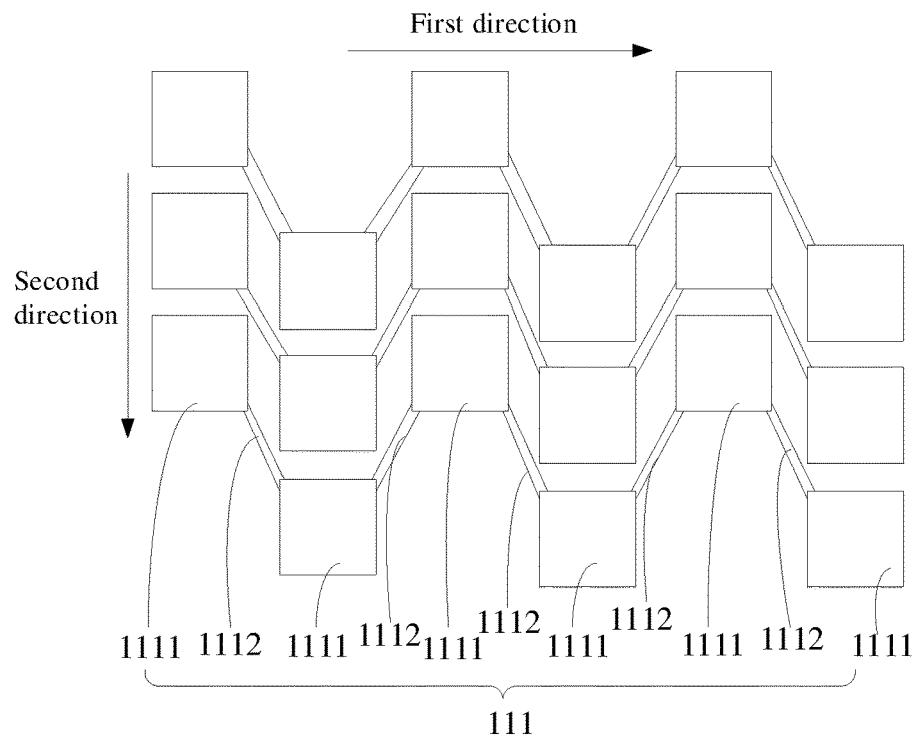
FIG. 7 is a schematic diagram of a projection of a third electrode located in a first display area on a base substrate according to an embodiment of the present disclosure.
Figure 8:
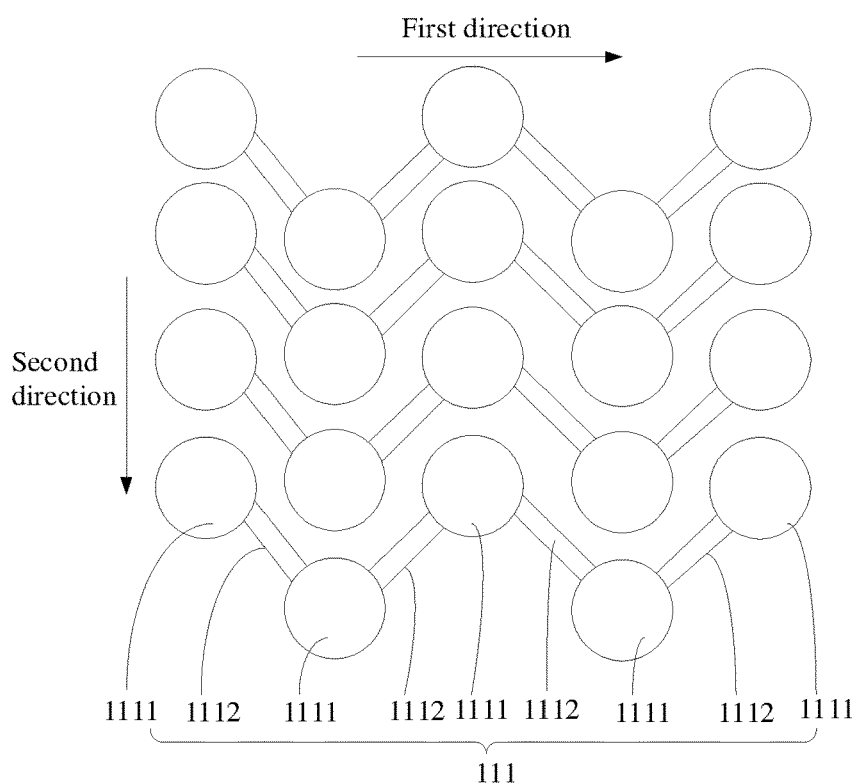
FIG. 8 is another schematic diagram of a projection of a third electrode located in a first display area on a base substrate according to an embodiment of the present disclosure, and the third electrode located in a first display area has a changed shape on the basis of FIG. 7.
Figure 9:
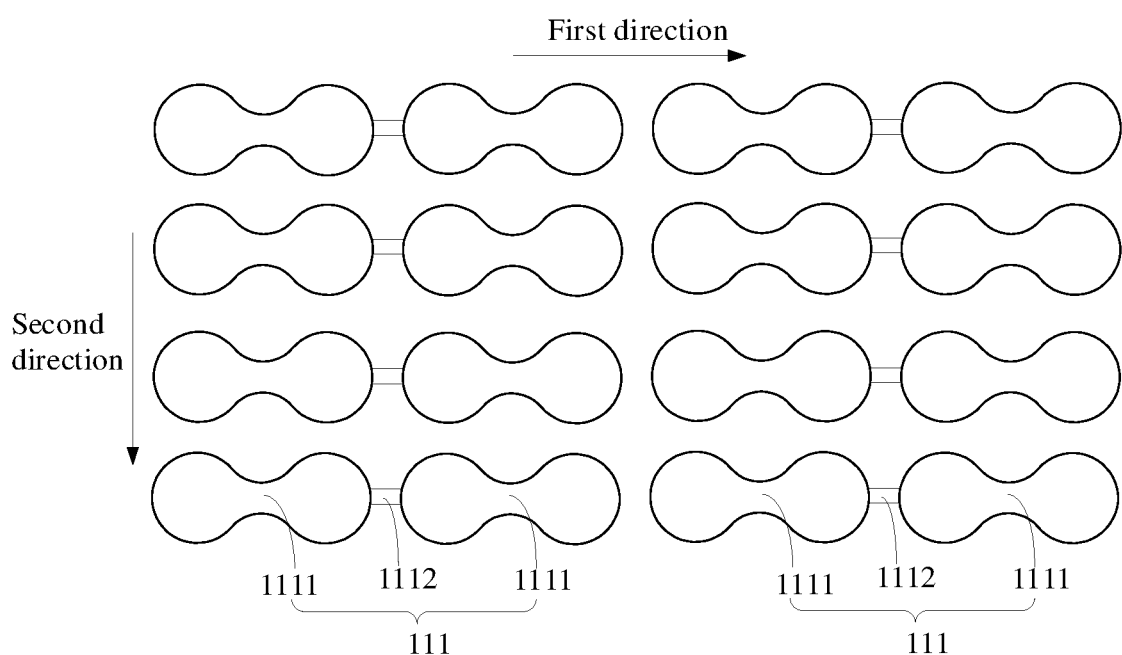
FIG. 9 is still another schematic diagram of a projection of a third electrode located in a first display area on a base substrate according to an embodiment of the present disclosure, and the third electrode located in a first display area has a changed shape on the basis of FIG. 7.

Optionally, referring to FIGS. 7-9, the third electrode 111 may include two or more electrode blocks 1111 arranged at intervals in the first direction, and the third electrode 111 may further include a connecting portion 1112 provided between the two adjacent electrode blocks 1111, and the two adjacent electrode blocks 1111 are electrically connected by the connecting portion 1112. In this way, the electrode blocks 1111 in the third electrode 111 may be provided with a signal through one data line or one scan line, which can reduce a complexity of wiring in the first display area 10, such that an influence of superposition of diffraction patterns caused by a complex wiring in the first display area 10 on imaging can be reduced when external light enters to the first display area 10, thereby improving a quality of images taken by a camera provided on a backlight surface of the first display area 10 and avoiding image distortion. In addition, a plurality of electrode blocks in the same third electrode 111 may be electrically connected with each other, such that the light-emitting structure blocks disposed on the plurality of electrode blocks 1111 correspondingly in the same third electrode 111 may be controlled to emit light or turn off at the same time, which can simplify the control of the first display area.

Optionally, the electrode blocks 1111 and the connecting portions 1112 in the same third electrode 111 may be disposed at the same layer. In this way, the electrode blocks 1111 and the connecting portions 1112 in the same third electrode 111 may be formed in the same process step, reducing a complexity of the manufacturing process.

Further, the connecting portion 1112 may have a width which is greater than 3 μm, and a length which is less than half of the maximum size of the electrode blocks 1111. Sizing the width of the connecting portion 1112 to be greater than 3 μm may enable the connecting portion to have a relatively small resistance. Sizing the length of the connecting portion 1112 to be less than half of the maximum size of the electrode blocks 1111 may enable the connecting portion 1112 to be provided with a relatively small influence on the size of the electrode block 1111, preventing a reduction in an effective light-emitting area of the first display area 10 due to the reduced size of the electrode block 1111 resulting from the connecting portion 1112 with a larger length.

Further, each of the electrode blocks 1111 of the third electrode 111 may include one first pattern unit or a plurality of first pattern units. A projection of the first pattern unit on the base substrate of the display substrate 100 may include a circle, an ellipse, a dumbbell shape, a gourd shape or a rectangle.

The first display area 10 as shown in FIG. 7 is provided with one third electrode 111 in the first direction. The third electrode 111 includes six electrode blocks 1111, each of the electrode blocks 1111 includes one first pattern unit, and the projection of the first pattern unit on the base substrate is a rectangle. The first display area 10 as shown in FIG. 8 is provided with one third electrode 111 in the first direction. The third electrode 111 includes five electrode blocks 1111, each of electrode blocks 1111 includes one first pattern unit, and the projection of the first pattern unit on the base substrate is a circle. The first display area 10 as shown in FIG. 9 is provided with two third electrodes 111 in the first direction. Each of the third electrodes 111 includes two electrode blocks 1111, each of the electrode blocks 1111 includes one first pattern unit, and the projection of the first pattern unit on the base substrate is a dumbbell shape. The projection of the first pattern unit on the base substrate includes a circle, an ellipse, a dumbbell shape, and a gourd shape, the shape of the first pattern unit may change a periodic structure of the third electrode 111 that produces diffraction, that is, the shape of the first pattern unit may change a distribution of the diffraction patterns, thereby reducing an influence of the patterns resulting from a diffraction effect on imaging when external light passes through the first display area 10. Moreover, when the projection of the first pattern unit on the base substrate has the above-mentioned shape, dimension of the third electrode 111 in the second direction may change continuously or intermittently along the first direction, and an distance between two adjacent third electrodes 111 in the second direction may change continuously or intermittently along the first direction, such that the two adjacent third electrodes produce diffraction at different positions, and the diffraction patterns produced at the different positions may cancel out each other, which can effectively reduce the influence of the diffraction patterns on imaging, thereby ensuring images taken by a camera provided below the first display area 10 have a high definition. The second direction is perpendicular to the first direction.

Optionally, referring to FIGS. 7 and 8, two adjacent electrode blocks 1111 of a plurality of electrode blocks 1111 of the same third electrode 111 may be arranged in a staggered manner in the first direction. Such an arrangement may enable an interval between the electrode blocks 1111 to change regularly, thereby further reducing an influence of patterns resulting from a diffraction effect on imaging when external light passes through the first display area 10.

Further, the plurality of electrode blocks 1111 of the same third electrode 111 may be arranged in a regular manner For example, two electrode blocks 1111 may be arranged to be symmetrical with respect to the electrode block 1111 located between the two electrode blocks 1111, in other words, two of the plurality of electrode blocks 1111 of the same third electrode 111 arranged to be spaced apart by one of the electrode blocks 1111 may be symmetrical with respect to the electrode block 1111 therebetween, but the arrangement manner is not limited to this. In this way, the arrangement of the electrode blocks 1111 may be more regular, and the arrangement of the light-emitting structure blocks disposed on the plurality of electrode blocks correspondingly may be more regular, such that openings of a mask used for preparing the light-emitting structure blocks may be arranged regularly. Moreover, the light-emitting structure blocks of the display substrate 100 which includes the first display area 10 and the second display area 20 may be manufactured in the same evaporation process by using the same mask. Since patterns on the mask are relatively uniform, spreading wrinkles may be reduced.

Optionally, the light-emitting structure block disposed on the electrode block 1111 correspondingly may include one second pattern unit or a plurality of second pattern units, and a shape of a projection of the second pattern unit on the base substrate may be the same with or different from that of the projection of the first pattern unit on the base substrate. Optionally, the second pattern unit is different from the first pattern unit, and a projection of the light-emitting structure block disposed on the electrode block 1111 correspondingly on the base substrate is different from a projection of the electrode block 1111 on the base substrate, so as to further reduce an influence of patterns resulting from a diffraction effect on imaging when light passes through the first display area 10.

The projection of the second pattern unit on the base substrate may include a circle, an ellipse, a dumbbell shape, a gourd shape or a rectangle.

Optionally, a portion of the first signal line 12 located in the first display area 10, the third electrode 111 and/or the fourth electrode may have a light transmittance which is greater than or equal to 70%, such that the first display area 10 may have a greater light transmittance to meet a light receiving requirement of the photosensitive component provided therebelow.

The portion (including the first segment 1211 and/or the third segment 1221) of the first signal line 12 located in the first display area 10, the third electrode 111 and/or the fourth electrode may include at least one of indium tin oxide, indium zinc oxide, silver-doped indium tin oxide, or silver-doped indium zinc oxide. Optionally, a transparent material used for preparing the portion of the first signal line 12 located in the first display area 10, the third electrode 111 and/or the fourth electrode includes silver-doped indium tin oxide or silver-doped indium zinc oxide, to reduce a resistance of the portion of the first signal line 12 located in the first display area 10, the third electrode 111 and/or the fourth electrode while ensuring a high light transmittance of the first display area 10.

Further, when the driving mode of the first sub-pixels 11 is the active driving mode, the first transistor 13 may also include at least one of indium tin oxide, indium zinc oxide, silver-doped indium tin oxide, or silver-doped indium zinc oxide, to further improve the light transmittance of the first display area.

The first display area 10 of the display substrate 100 according to the embodiments of the present disclosure may have a shape such as a drop shape, a circle, a rectangle, a semicircle, a semi-ellipse, or an ellipse. However, the shape of the first display area 10 is not limited to these, and the first display area 10 may be designed in other shapes according to actual conditions.

Embodiments of the present disclosure further provide a display panel including the above-described display substrate 100 and an encapsulation structure disposed at a side of the display substrate 100 deviating away from the base substrate.

Optionally, the first display area 10 may be at least partially surrounded by the second display area 20. As shown in FIG. 1, the first display area 10 is partially surrounded by the second display area 20, but in other embodiments, the first display area may be completely surrounded by the second display area.

Optionally, the encapsulation structure may include a polarizer which may at least cover the second display area 20. Further, the first display area 10 may not be covered by the polarizer. The photosensitive component which emits or receives light through the first display area 10 may be provided below the first display area 10. The polarizer may dissipate reflected light on a surface of the display panel, which can improve user experience. The first display area 10 is not provided with a polarizer, which can increase the light transmittance of the first display area 10 and ensure a normal operation of the photosensitive component provided below the first display area 10.

In the display panel according to the embodiments of the present disclosure, the shielding layer 30 is provided in the second display area 20, and a portion of the first signal line 12 located in the second display area 20 is provided above the shielding layer 30 and the pixel circuit 22 is provided below the shielding layer 30, such that the shielding layer 30 can shield an electric field created between the first signal line 12 and the component of the pixel circuit 22 for the second sub-pixels 21, so as to avoid an influence of the portion of the first signal line 12 located in the second display area 20 on a signal received by the pixel circuit 22 for the second sub-pixels 21, ensuring the display effect of the second display area 20 and improving user experience.

Embodiments of the present disclosure further provide a display apparatus including: a main body having a component arranging area; and the above-described display panel covering the main body. The component arranging area may be located below the first display area 10 and provided with at least one photosensitive component therein which emits or receives light through the first display area 10.

The at least one photosensitive component may include a camera and/or a light sensor. Components other than the photosensitive component, such as a gyroscope and/or an earpiece, may also be provided in the component arranging area. The component arranging area may be a notch area, and the first display area 10 of the display panel may be disposed above the notch area, such that the photosensitive component may emit or receive light through the first display area 10.

The above-described display apparatus may be a mobile phone, a tablet, a palmtop computer, an iPod, and other digital devices.

In the display apparatus according to the embodiments of the present disclosure, the shielding layer 30 is provided in the second display area 20, and a portion of the first signal line 12 located in the second display area 20 is provided above the shielding layer 30 and the pixel circuit 22 is provided below the shielding layer 30, such that the shielding layer 30 can shield an electric field created between the first signal line 12 and the component of the pixel circuit 22 for the second sub-pixels 21, so as to avoid an influence of the portion of the first signal line 12 located in the second display area 20 on a signal received by the pixel circuit 22 for the second sub-pixels 21, ensuring the display effect in the second display area 20 and improving user experience.

In the drawings, sizes of layers and areas may be exaggerated for clarity of illustration. Also, when an element or layer is referred to as being "on" another element or layer, it may be directly on the other element, or there may be more than one intervening layer or element. In addition, when an element or layer is referred to as being "below" another element or layer, it may be directly below the other element, or there may be more than one intervening layer or element. In addition, when a layer or element is referred to as being "between" two layers or two elements, it may be the only layer or element between the two layers or two elements, or there may be more than one intervening layer or element. Similar reference numerals indicate similar elements throughout.

In the present disclosure, terms "first" and "second" are only used for descriptive purposes, and cannot be understood as indicating or implying relative importance. The term "a plurality of" refers to two or more, unless specifically defined otherwise.

After considering the specification and practicing the disclosure disclosed herein, those skilled in the art will easily conceive of other embodiments of the present disclosure. The present disclosure is intended to cover any variations, uses, or adaptive changes of the present disclosure. These variations, uses, or adaptive changes follow general principles of the present disclosure and include common knowledge or commonly used technical means in the art that are not disclosed in the present disclosure. The description and embodiments are only regarded as exemplary, and the true scope and spirit of the present disclosure are indicated by the following claims.

It should be understood that the present disclosure is not limited to the precise structures that have been described above and shown in the drawings, and various modifications and changes may be made without departing from the scope thereof. The scope of the present disclosure is only limited by the appended claims.

The invention claimed is:

1. A display substrate, comprising:
   a first display area comprising a plurality of first sub-pixels;
   a second display area comprising a plurality of second sub-pixels;
   a shielding layer provided in the second display area;
   a first signal line configured to provide a control signal to the first sub-pixels, wherein the first signal line extends from the first display area through the second display area, and a portion of the first signal line located in the second display area is provided above the shielding layer; and
   at least one pixel circuit provided below the shielding layer and configured to drive the second sub-pixels;
   wherein the shielding layer is configured to shield an electric field between the portion of the first signal line located in the second display area and the at least one pixel circuit.

2. The display substrate of claim 1, wherein:
   the shielding layer is connected with a voltage stabilization signal of the display substrate; or
   the shielding layer is connected to a voltage source with a stable voltage.

3. The display substrate of claim 1, wherein:
   the shielding layer covers the second display area; or
   the shielding layer has a same shape as the portion of the first signal line located in the second display area, and the shielding layer is provided below the portion of the first signal line located in the second display area correspondingly.

4. The display substrate of claim 1, wherein:
a portion of the first signal line located in the first display area and/or the shielding layer has a light transmittance which is greater than or equal to 70%;
the portion of the first signal line located in the first display area and/or the shielding layer comprises at least one of indium tin oxide, indium zinc oxide, silver-doped indium tin oxide, or silver-doped indium zinc oxide.

5. The display substrate of claim 1, wherein:
the first signal line comprises a first segment located in the first display area and a second segment located in the second display area;
the first display area comprises a plurality of layers, and the second display area comprises a plurality of layers; and
the first segment and the second segment are located at different layers, an insulating layer is provided between the first segment and the second segment, a through-hole is provided in the insulating layer, and the first segment is connected with the second segment through the through-hole.

6. The display substrate of claim 5, wherein:
each of the second sub-pixels comprises a first electrode, a first light-emitting structure located on the first electrode, and a second electrode located on the first light-emitting structure, and
the first electrodes of the second sub-pixels are provided above the shielding layer, the second segment and the first electrodes are formed in a same process step, and the first segment and the shielding layer are formed in a same process step.

7. The display substrate of claim 5, wherein:
each of the second sub-pixels comprises a first electrode, a first light-emitting structure located on the first electrode, and a second electrode located on the first light-emitting structure;
each of the first sub-pixels comprises a third electrode, a second light-emitting structure located on the third electrode, and a fourth electrode located on the second light-emitting structure;
the first electrodes of the second sub-pixels are provided above the shielding layer;
the portion of the first signal line located in the second display area and the first electrodes are formed in a same process step;
a portion of the first signal line located in the first display area and the third electrodes of the first sub-pixels are formed in a same process step; and
the first electrodes, the third electrodes, the first segment and the second segment are located at a same layer, and the first segment and the second segment are connected.

8. The display substrate of claim 1, wherein the first signal line comprises a first data line configured to provide a data signal to the first sub-pixels.

9. The display substrate of claim 1, wherein the first signal line comprises a first scan line configured to provide a scan signal to the first sub-pixels.

10. The display substrate of claim 1, wherein:
a driving mode of the first display area comprises a passive driving mode or an active driving mode;
when the driving mode of the first display area is the active driving mode, the first display area is further provided with a plurality of first transistors electrically connected with the first sub-pixels in a one-to-one correspondence, and the first signal line is electrically connected with the first transistors.

11. The display substrate of claim 10, wherein:
drains of the first transistors and a portion of the first signal line located in the first display area are formed in a same process step.

12. The display substrate of claim 1, wherein:
the second display area is further provided with a second signal line therein, the second signal line is provided below the shielding layer and configured to provide a control signal to the second sub-pixels.

13. The display substrate of claim 12, wherein:
the second signal line comprises a second data line and/or a second scan line, the second data line is configured to provide a data signal to the second sub-pixels, and the second scan line is configured to provide a scan signal to the second sub-pixels.

14. The display substrate of claim 1, wherein the first display area has a light transmittance which is greater than that of the second display area;
each of the first sub-pixels comprises:
a third electrode comprising at least one electrode block;
a second light-emitting structure located on the third electrode; and
a fourth electrode located on the second light-emitting structure.

15. The display substrate of claim 14, wherein the third electrode comprises two or more electrode blocks arranged at intervals in a first direction, and the third electrode further comprises a connecting portion provided between two adjacent electrode blocks, the two adjacent electrode blocks are electrically connected by the connecting portion; the connecting portion and the electrode blocks are located at a same layer, and the connecting portion has a width which is greater than 3 μm and a length which is less than half of a maximum size of the electrode block.

16. The display substrate of claim 14, wherein the display substrate comprises a base substrate, and the third electrodes are located above the base substrate; each electrode block comprises at least one first pattern unit, and a projection of the first pattern unit on the base substrate comprises a circle, an ellipse, a dumbbell shape, a gourd shape or a rectangle.

17. The display substrate of claim 16, wherein the second light-emitting structure comprises a light-emitting structure block disposed on the electrode block correspondingly, the light-emitting structure block comprises at least one second pattern unit, and a projection of the second pattern unit on the base substrate is same with or different from the projection of the first pattern unit on the base substrate;
the projection of the second pattern unit on the base substrate comprises a circle, an ellipse, a dumbbell shape, a gourd shape or a rectangle;
a portion of the first signal line located in the first display area, the third electrode and/or the fourth electrode has a light transmittance which is greater than or equal to 70%;
the portion of the first signal line located in the first display area, the third electrode and/or the fourth electrode comprises at least one of indium tin oxide, indium zinc oxide, silver-doped indium tin oxide, or silver-doped indium zinc oxide.

18. The display substrate of claim 14, wherein the third electrode comprises a plurality of electrode blocks, two adjacent electrode blocks of the plurality of electrode blocks of a same third electrode are arranged in a staggered manner in a first direction;

two electrode blocks of the plurality of electrode blocks of the same third electrode are symmetrical with respect to an electrode block located between the two electrode blocks.

19. A display panel comprising:

the display substrate of claim 1; and an encapsulation structure, wherein the first display area is at least partially surrounded by the second display area;

the encapsulation structure comprises a polarizer which at least covers the second display area; and the first display area is not covered by the polarizer.

20. A display apparatus comprising:

a main body having a component arranging area; and the display panel of claim 19 covering the main body, wherein the component arranging area is located below the first display area and provided with at least one photosensitive component therein which emits or receives light through the first display area; and the at least one photosensitive component comprises a camera and/or a light sensor.

\* \* \* \* \*